United States Patent
Seifert et al.

(10) Patent No.: US 11,106,313 B1
(45) Date of Patent: Aug. 31, 2021

(54) CAPACITIVE SENSOR SYSTEM FOR TOUCH DETECTION

(71) Applicant: Kostal Automobil Elektrik GmbH & Co. KG, Luedenscheid (DE)

(72) Inventors: Matthias Seifert, Bochum (DE); Christian Brueggemann, Bochum (DE)

(73) Assignee: KOSTAL Automobil Elektrik GmbH & Co. KG, Luedenscheid (DE)

( * ) Notice: Subject to any disclaimer, the term of this patent is extended or adjusted under 35 U.S.C. 154(b) by 0 days.

(21) Appl. No.: 17/120,359

(22) Filed: Dec. 14, 2020

Related U.S. Application Data

(63) Continuation of application No. PCT/EP2019/067318, filed on Jun. 28, 2019.

(30) Foreign Application Priority Data

Jun. 30, 2018 (DE) ..................... 10 2018 005 248.7

(51) Int. Cl.
*G06F 3/041* (2006.01)
*G06F 3/044* (2006.01)

(52) U.S. Cl.
CPC ........ *G06F 3/04186* (2019.05); *G06F 3/0443* (2019.05)

(58) Field of Classification Search
CPC .............. G06F 3/04183; G06F 3/0433; G06F 3/044–0448; G06F 3/04186
See application file for complete search history.

(56) References Cited

U.S. PATENT DOCUMENTS 5,561,247 A * 10/1996 Mutoh .................. G01L 9/0075
73/723
8,182,104 B2   5/2012 Reinker
(Continued)

FOREIGN PATENT DOCUMENTS

DE   102004038872 A1   3/2006
DE   102012205126 A1   10/2013

OTHER PUBLICATIONS

European Patent Office, International Search Report for International Application No. PCT/EP2019/067318, dated Aug. 13, 2019.
(Continued)

*Primary Examiner* — David Tung
(74) *Attorney, Agent, or Firm* — Brooks Kushman P.C.

(57) ABSTRACT

A capacitive sensor system for touch detection includes a sensor surface, a first sensor electrode, a second sensor electrode, and an evaluation device. The sensor electrodes are both situated on and border the sensor surface. The first sensor electrode has a first closed conductor loop and the second sensor electrode has a second closed conductor loop. The first closed conductor loop surrounds the second closed conductor loop without the closed conductor loops touching each other. Each sensor electrode generates a sensor signal that depends on a position of a touch of an object on the sensor surface relative to the closed conductor loop of the sensor electrode. The evaluation device detects the touch based on a comparison of a ratio value to a threshold value, wherein the ratio value is a ratio of (i) a difference and (ii) a sum of the sensor signals.

16 Claims, 3 Drawing Sheets

(56) References Cited

U.S. PATENT DOCUMENTS

2007/0247446 A1    10/2007  Orsley et al.
2010/0259283 A1    10/2010  Togura
2014/0015595 A1     1/2014  Van Ausdall et al.
2016/0154507 A1*    6/2016  Bharathan .............. G06F 3/014
                                                        345/174

OTHER PUBLICATIONS

German Patent and Trademark Office, German Search Report for corresponding German Patent Application No. 10 2018 005 248.7 dated Feb. 13, 2019.

* cited by examiner

CAPACITIVE SENSOR SYSTEM FOR TOUCH DETECTION

CROSS-REFERENCE TO RELATED APPLICATIONS

This application is a continuation of International Application No. PCT/EP2019/067318, published in German, with an International filing date of Jun. 28, 2019, which claims priority to DE 10 2018 005 248.7, filed Jun. 30, 2018; the disclosures of which are hereby incorporated in their entirety by reference herein.

TECHNICAL FIELD

The present invention relates to a capacitive sensor system for touch detection, the capacitive sensor system including a sensor surface on which at least one sensor electrode is situated and an evaluation device for evaluating an electrical sensor signal of the sensor electrode that is influenceable by the position of a measured object in a direction in the plane of the sensor surface.

BACKGROUND

Capacitive sensor systems of the type stated here are used as touch-sensitive control elements on operator panels, for example, in consumer electronic devices or also in the dashboard area of motor vehicles.

In common systems for touch detection using a capacitive sensor system in the single-pole method, a preferably full-surface sensor electrode is used for each individual operating surface. The lateral delimitation of the touch-sensitive surfaces is achieved by geometric adaptation of the sensor electrodes. Areas of a sensor through which light passes are either excluded or implemented using transparent conductive materials. For detecting a touch, the sensor signal must exceed a signal threshold.

These systems function well as long as the size of the touch-sensitive sensor surfaces is smaller than or similar to the measured object, in particular an operating finger, for example. For a sensor surface that is much larger than a finger, the sensor signal drops off only slowly beyond the edge of the sensor surface in the plane of the operating surface. Such a sensor system is generally designed to function robustly for different finger sizes, and in some circumstances, also for operation while wearing gloves. A threshold value condition that is modified for small fingers may then, for large fingers, result in inaccurate touch detection a few centimeters outside the operating surface.

If it is necessary to exclude the interior region of the sensor surface, for example, for lighting elements, then the sensor signal once again drops off in this region, and the threshold value must be lowered further. As a result, the touch detection in the operating plane migrates even farther to the outside. Such a sensor system in which the sensor is made up of a conductor loop that borders the actual operating surface thus functions at least very imprecisely, and even incorrectly, with regard to the association of functions and sensor surfaces.

SUMMARY

An object is to provide a capacitive sensor system for touch detection in a simple and cost-effective manner in such a way that the touch detection has a preferably low dependency on the specific configuration of the measured object.

An embodiment of the present invention provides a capacitive sensor system for touch detection. The capacitive sensor system includes a sensor surface and an evaluation device. A first sensor electrode and a second sensor electrode are arranged on and border the sensor surface. Each sensor electrode generates an electrical sensor signal that depends on the position of a measurement object in a direction in the plane of the sensor surface relative to the sensor electrode. The sensor electrodes each have a closed conductor loop which run parallel to one another, without touching each other. The closed conductor loop of the first sensor electrode surrounds the closed conductor loop of the second sensor electrode. The sensor electrodes are connected to respective inputs of the evaluation device for the evaluation device to receive the sensor signals. The evaluation device evaluates the sensor signals by determining a ratio value from the ratio of the difference and the sum of the sensor signals and then by comparing the ratio value to a threshold value. The evaluation device detects a touch depending on the comparison. For instance, the evaluation device detects a touch when the ratio value exceeds the threshold value.

In carrying out any of the above and/or other objects, a capacitive sensor system for touch detection is provided. The capacitive sensor system includes a sensor surface, a first sensor electrode, a second sensor electrode, and an evaluation device. The sensor electrodes are both situated on and border the sensor surface. The first sensor electrode has a first closed conductor loop and the second sensor electrode has a second closed conductor loop. The first closed conductor loop surrounds the second closed conductor loop without the closed conductor loops touching each other. Each sensor electrode generates a sensor signal that depends on a position of a touch of an object on the sensor surface relative to the closed conductor loop of the sensor electrode. The evaluation device detects the touch based on a comparison of a ratio value to a threshold value, wherein the ratio value is a ratio of (i) a difference and (ii) a sum of the sensor signals.

In embodiments, the closed conductor loops are parallel, non-touching closed conductor loops.

In embodiments, sections of the closed conductor loops are in parallel to one another without touching each other.

Both of the closed conductor loops may have a circular, rectangular, or polygonal arrangement. In an embodiment, both of the closed conductor loops have a rectangular arrangement.

The closed conductor loops may be concentric with one another.

In carrying out any of the above and/or other objects, a method for the capacitive sensor system is provided. The method includes generating, by the first sensor electrode, a first sensor signal that depends on a position of a touch of an object on the sensor surface relative to the closed conductor loop of the first sensor electrode and generating, by the second sensor electrode, a second sensor signal that depends on the position of the touch of the object on the sensor surface relative to the closed conductor loop of the second sensor electrode. The method further includes detecting, by the evaluation device, the touch based on a comparison of a ratio value to a threshold value, wherein the ratio value is a ratio of (i) a difference and (ii) a sum of the sensor signals.

In carrying out any of the above and/or other objects, another capacitive sensor system for touch detection is provided. This capacitive sensor system includes a sensor surface, a first sensor electrode having a first conductor section which forms a first closed conductor loop, and a second sensor electrode having a second conductor section which forms a second closed conductor loop. The closed conductor loops are both situated on and border the sensor surface, the first closed conductor loop surrounds the second closed conductor loop, and the closed conductor loops are parallel with one another and non-touching each other. This capacitive sensor system further includes an evaluation device for evaluating a first sensor signal of the first sensor electrode and a second sensor signal of the second sensor electrode. The first sensor signal depends on a position of a touch of an object in one direction in a plane of the sensor surface relative to the first closed conductor loop and the second sensor signal depends on the position of the touch of the object in the one direction in the plane of the sensor surface relative to the second closed conductor loop. The evaluation device determines a ratio value from a ratio of (i) a difference of the second sensor signal and the first sensor signal and (ii) a sum of the first sensor signal and the second sensor signal, compares the ratio value to a threshold value, and detects a touch based on the comparison of the ratio value to the threshold value.

DE 10 2004 038 872 A1 describes a capacitive sensor system for touch detection. This capacitive sensor system includes a sensor surface and an evaluation device. First and second sensor electrodes are situated on and border the sensor surface. The evaluation device is for evaluating an electrical sensor signal of each sensor electrode. The electrical sensor signal of each sensor electrode depends on the position of a measured object in a direction in the plane of the sensor surface. The sensor electrodes have conductor sections in parallel to one another. The conductor sections form triangular arrangements of conductor surfaces. The first sensor electrode surrounds the second sensor electrode. The sensor electrodes are connected to respective inputs of the evaluation device. The evaluation device receives the sensor signals of the sensor electrodes and determines a ratio value from the ratio of the difference to the sum of the detected sensor signals. The evaluation device then compares the ratio value to a threshold value.

This capacitive sensor system uses a sensor element that is divided into at least two closely adjacent sensor surfaces, wherein in one direction a first sensor element becomes progressively smaller and a second sensor element becomes progressively larger. As a result, the detectable sensor signal changes with the particular location of the actuation. The sensor surfaces are therefore formed essentially by interlinked triangular surfaces.

In contrast to this capacitive sensor system, in embodiments of the present invention, parallel, non-touching closed conductor loops provide touch detection.

BRIEF DESCRIPTION OF THE DRAWINGS

A functional principle of a capacitive sensor system according to the present invention for touch detection is illustrated and explained below with reference to the Figures. In addition, the problem leading to the present invention is explained in greater detail based on a conventional capacitive sensor system.

DETAILED DESCRIPTION

Detailed embodiments of the present invention are disclosed herein; however, it is to be understood that the disclosed embodiments are merely exemplary of the present invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 5:
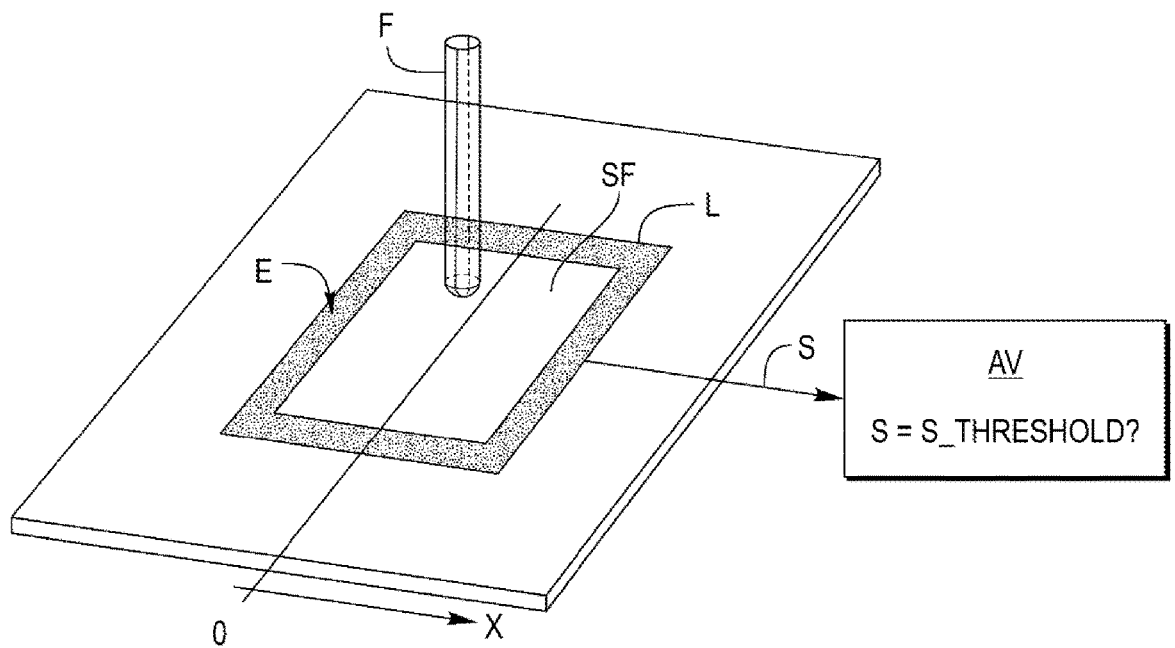
FIG. 5 illustrates a schematic diagram of a conventional capacitive sensor system for touch detection.
Figure 6:
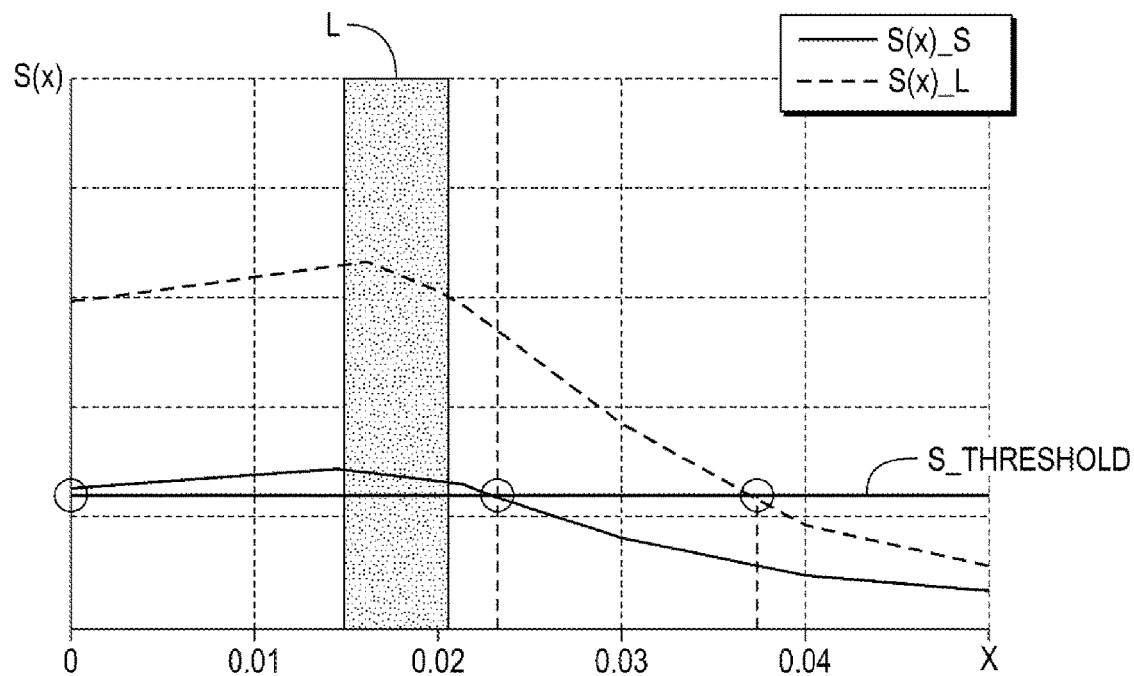
FIG. 6 illustrates a graph of sensor signal curves of the sensor electrode of the conventional capacitive sensor system.

Referring now to FIG. 5, a schematic diagram of a conventional capacitive sensor system for touch detection is shown. A capacitive touch switch having a rectangular metallic frame as a sensor element is known, for example, from DE 10 2007 044 393 B3 (counterpart U.S. Pat. No. 8,182,104). FIG. 6 illustrates a graph of qualitative sensor signal curves of the sensor electrode of the conventional capacitive sensor system. The problem leading to the capacitive sensor system in accordance with embodiments of the present invention is explained in greater detail based on this diagram.

As shown in FIG. 5, the conventional capacitive sensor system includes a sensor electrode E. Sensor electrode E is in the form of a closed conductor loop L. The closed conductor loop forms the edge section of a rectangular sensor surface SF. A direction coordinate X whose origin point 0 is arbitrarily situated in the center of the associated lateral extension region of sensor surface SF is illustrated parallel to a lateral line of sensor surface SF. Direction coordinate X is strictly an example of one of the lateral directions in which a measured object F may be positioned relative to sensor surface SF. Lateral positionings of measured object F in a direction other than the illustrated X direction result in a qualitatively similar course.

The conventional capacitive sensor system detects touches of a measured object F onto sensor surface SF. Herein, it is assumed, without limitation of universality, that measured object F is a human finger.

Sensor electrode E emits a sensor signal S dependent on the position of measured object F relative to sensor electrode E. An evaluation device of the conventional capacitive sensor system receives sensor signal S from sensor electrode E. Electronic evaluation device AV compares sensor signal S to a predefined signal threshold value S_threshold. As an example, it is illustrated in FIG. 5 that evaluation device AV checks whether sensor signal S is equal to signal threshold S_threshold. Alternatively, evaluation device AV may determine that a valid sensor actuation is present when the value of sensor signal S either falls below or exceeds signal threshold S_threshold.

Determining a suitable signal threshold S_threshold is not without problems. The dependency of the sensor signal curve S(x) on the position x of a finger F is plotted along the direction coordinate X in the diagram in FIG. 6. The size of finger F touching sensor surface SF is considered as a relevant parameter that also influences the sensor signal S(x). Therefore, the sensor signal curves S(x) in FIG. 6 are plotted once for a large finger as sensor signal curve S(x)_L and once for a small finger as the sensor signal curve S(x)_S.

Large finger sensor signal curve S(x)_L and small finger sensor signal curve S(x)_S are illustrated here in a strictly qualitative manner, and in addition the numerical figures indicated on the abscissa are based on arbitrary units. However, emphasis is placed on the point x=0, which refers to the line in the center of sensor surface SF in FIG. 5, as well as the black area of the graphic which, extended laterally along direction coordinate X, represents the position of the right-most side of closed conductor loop L of sensor electrode E shown in FIG. 5.

The two graphs of sensor signal curves S(x)_L and S(x)_S in FIG. 6 show that sensor signal curve S(x) initially rises slightly during displacement of a large finger F and a small finger F in the positive X direction from the center toward the edge of sensor surface SF, and then falls more or less quickly outside sensor surface SF, i.e., on the other side of closed conductor loop L.

These sensor signal curves S(x)_L and S(x)_S may result in ambiguities with regard to the particular threshold value condition. It is assumed that the horizontal solid line in FIG. 6 marks a signal threshold S_threshold. It is then apparent from the illustrated bordering data points that for sensor signal curve S(x)_S for a small finger, signal threshold S_threshold is reached at two positions x inside and outside sensor surface SF (i.e., inside closed conductor loop L and outside closed conductor loop L), since at that location, sensor signal values occur that are identical to the value of signal threshold S_threshold. Thus, it is not clear from the determined sensor signal S whether finger F at that moment is approximately in the center or outside sensor surface SF. For sensor signal curve S(x)_L for a large finger, a sensor value at the level of signal threshold S_threshold results in an even greater distance to the side of sensor surface SF.

Since it is generally not known whether sensor surface SF is touched by a large or a small finger, ambiguities result in the interpretation of a detected sensor signal S by evaluation device AV. This may cause operating errors which should be avoided.

Figure 1:
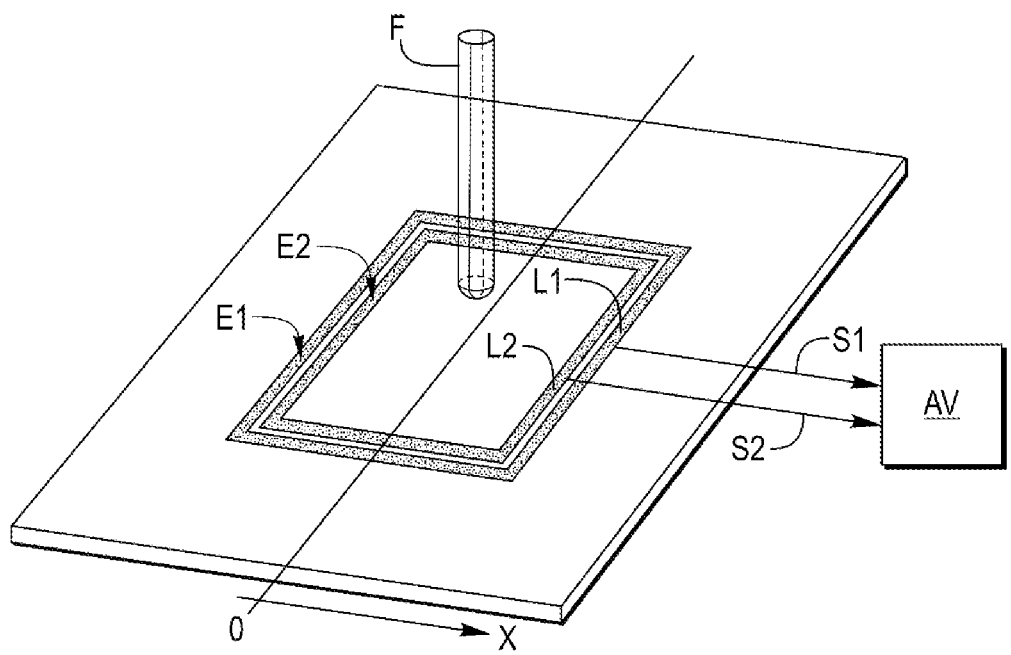
FIG. 1 illustrates a schematic diagram of a capacitive sensor system for touch detection according to an embodiment of the present invention.

For solving this problem, FIG. 1 shows a schematic illustration of a capacitive sensor system for touch detection according to an embodiment of the present invention. The capacitive sensor system includes a first sensor electrode E1 and a second sensor electrode E2. Sensor electrodes E1, E2 are both situated on and border a sensor surface SF of the capacitive sensor system. First sensor electrode E1 is in the form of a first closed conductor loop L1. Second sensor electrode E2 is in the form of a second closed conductor loop L2. Closed conductor loops L1, L2 are each in the form of circular, rectangular, or polygonal closed conductor loops, which enclose one another in a preferably mutually parallel arrangement without touching each other. For instance, as shown in FIG. 1, closed conductor loops L1, L2 are both rectangular closed conductor loops and first closed conductor loop L1 surrounds second conductor loop L2 with the sides of closed conductor loops L1, L2 running in parallel to one another, without closed conductor loops L1, L2 touching one another. Put another way, closed conductor loops L1, L2 are concentric with one another and do not touch one another.

As closed conductor loop L1 of sensor electrode E1 surrounds closed conductor loop L2 of sensor electrode E2, sensor electrode E1 is an outer sensor electrode and sensor electrode E2 is an inner sensor electrode, as shown in FIG. 1.

Sensor electrodes E1, E2 each emit their own sensor signals S1, S2. Sensor signal S1 of first sensor electrode E1 depends on a position of a measured object F relative to closed conductor loop L1 of first sensor electrode E1. Sensor signal S2 of second sensor electrode E2 depends on the position of measured object relative to closed conductor loop L2 of second sensor electrode E2. Sensor electrodes E1, E2 supply sensor signals S1, S2 to respective inputs of an evaluation device AV of the capacitive sensor system. Evaluation device AV determines a ratio value from a ratio of (i) a difference of sensor signal S2 and sensor signal S1 and (ii) a sum of sensor signal S1 and sensor signal S2. Evaluation device AV detects a touch depending on a comparison of the ratio value to a threshold value.

Figure 2:
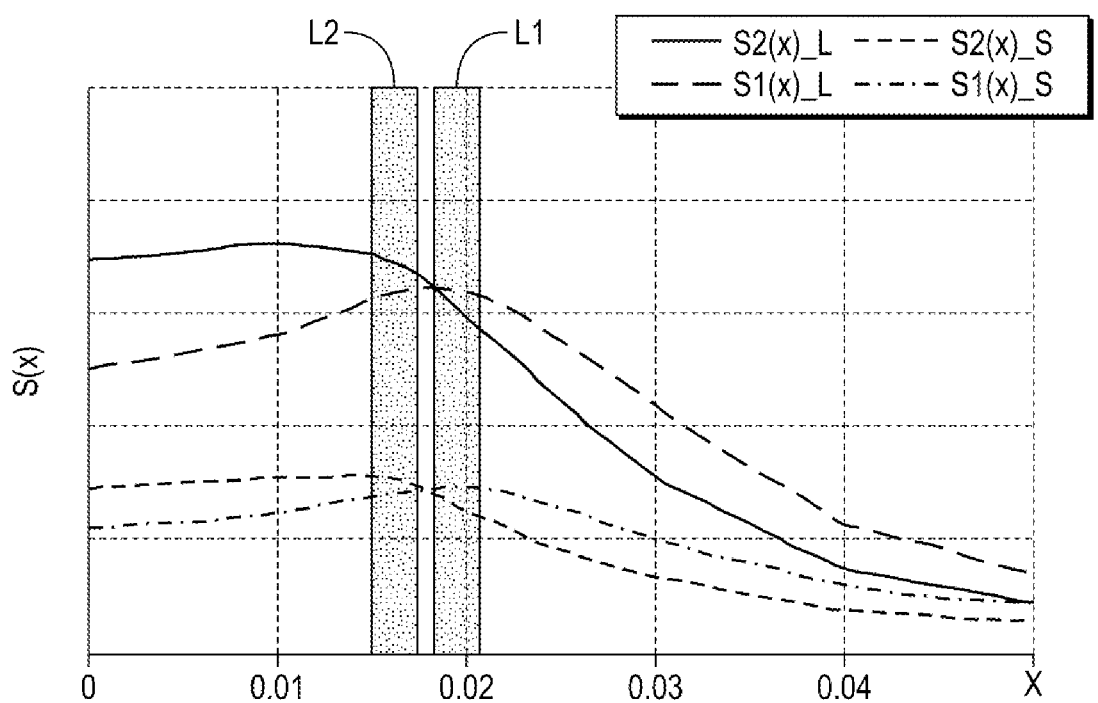
FIG. 2 illustrates a graph of sensor signal curves of first and second sensor electrodes of the capacitive sensor system as a function of lateral touch position.

Referring now to FIG. 2, with continual reference to FIG. 1, a graph of sensor signal curves of sensor electrodes E1, E2 as a function of lateral touch position is shown. FIG. 2 illustrates, for a given sensor system, typical curves S(x) of these sensor signals S1, S2 as a function of the finger position x in the X direction indicated in FIG. 1, analogously to the illustration in FIG. 6. The graphs depicted as dashed lines represent sensor signal curves $S1(x)\_S$ and $S1(x)\_L$, which result from sensor signals S1 of outer sensor electrode E1, while the graphs depicted as solid lines represent the sensor signal curves $S2(x)\_S$ and $S2(x)\_L$ for sensor signals S2 of inner sensor electrode E2. The indices _S and _L are in turn used to distinguish between a small or a large finger as the particular measured object F.

It is apparent from FIG. 2 that, regardless of the size of finger F, the signal value curves $S2(x)\_S$, $S2(x)\_L$ of inner sensor electrode E2 always have greater values than the signal value curves $S1(x)\_S$, $S1(x)\_L$ of outer sensor electrode E1, as long as finger F is inside sensor surface SF bordered by inner sensor electrode E2, and conversely, outer sensor electrode E1 always delivers greater signal values $S1(x)\_S$ and $S1(x)\_L$ as soon as finger F is outside the area bordered by outer sensor electrode E1.

For a finger F of a given size, sensor signal curves $S1(x)\_S$ and $S2(x)\_S$ as well as $S1(x)\_L$ and $S2(x)\_L$ in each case assume exactly the same value when the finger is in the area between the sensor electrode E1, E2, which is apparent at the intersection points of the corresponding plots in FIG. 2.

The sensor signal curves S(x) illustrated in FIG. 2 are characteristic for a certain specific design of a sensor system, and therefore may in principle be used by evaluation device AV, depicted in FIG. 1, for comparison with a threshold value. However, these comparisons would also be subject to significant uncertainties, since as shown in FIG. 2, different sizes of finger F result in sensor signals S(x) that are very different quantitatively. Only the positioning of a finger F exactly in the area between sensor electrode E1, E2 allows a precise identification in every case, since at this location the sensor signals S1 and S2 of sensor electrodes E1, E2 have exactly the same value regardless of the size of finger F.

Figure 3:
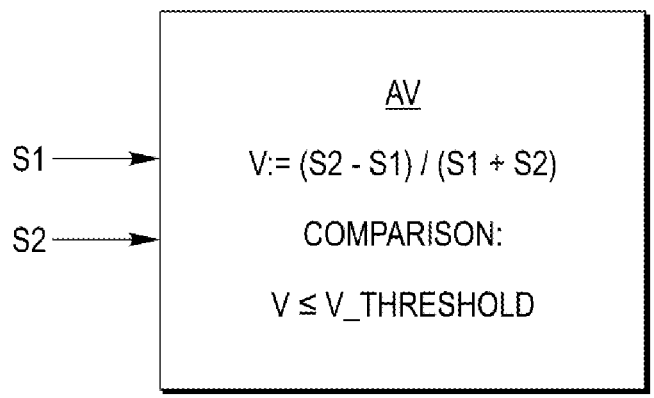
FIG. 3 illustrates a schematic diagram of an evaluation device of the capacitive sensor system.

As schematically illustrated in FIG. 3, a much more accurate determination of a threshold value condition is achieved in that evaluation device AV forms a ratio value V which, except for additive or multiplicative constants that may be present, is given by:

$$V := (S2-S1)/(S1+S2)$$

The ratio value V thus results from the difference S2−S1 of sensor signals S1, S2 of sensor electrodes E1, E2 (i.e., the difference of sensor signal S2 and sensor signal S1) divided by the sum S1+S2 of sensor signals S1, S2 of sensor electrodes E1, E2 (i.e., the sum of sensor signal S1 and sensor signal S2).

The difference S2−S1 between the two sensor signals S1, S2 is a value that provides information about the position of a finger F in the plane of sensor surface SF. The sum S1+S2 of the two sensor signals S1, S2 qualitatively corresponds approximately to the signal of an individual sensor electrode E1, E2, and scales with the finger size. It may therefore be used to normalize the difference signal S2−S1.

The same as for the individual sensor signals, a ratio function V(x) for the dependency of the ratio value V on the finger position may also be calculated for the ratio value V:

$$V(x):=(S2(x)-S1(x))/(S1(x)+S2(x)),$$

which once again is typical for a given sensor system.

Figure 4:
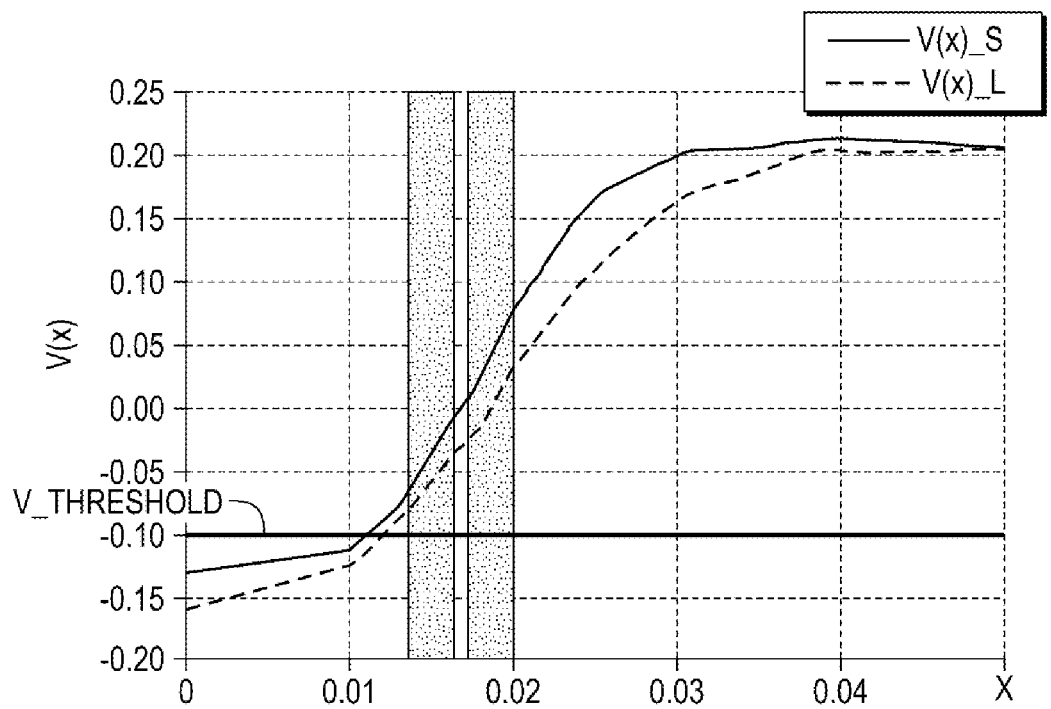
FIG. 4 illustrates a graph of sensor signal ratio function curves as a function of lateral touch position.

FIG. 4 illustrates a graph of sensor signal ratio function curves as a function of lateral touch position. In FIG. 4, two graphs V(x)_L, V(x)_S are plotted which represent the ratio function V(x), calculated once from sensor signal data for a large finger and calculated once from sensor signal data for a small finger. It is apparent that both ratio functions V(x)_L, V(x)_S have a quite similar curve, qualitatively as well as quantitatively.

For the evaluation it is advantageous that the ratio functions V(x)_L, V(x)_S drop off monotonically toward the origin point 0, and thus toward the center of sensor surface SF, and have the steepest slope, in particular in the area of the illustrated sections of closed conductor loops L1, L2. In addition, the function values of the ratio functions V(x) both have a zero crossing here. By use of these properties, ambiguities, which otherwise result in major errors in the touch detection, may be satisfactorily avoided.

The two ratio functions V(x)_L and V(x)_S illustrated in FIG. 4 show that their function values for different sizes of fingers F have a relatively small fluctuation margin. For touch detection, it is thus possible to satisfactorily set a threshold value V_threshold that is also suitable for different sizes of fingers F.

Thus, a threshold value V_threshold having the value −0.10 by way of example is marked by a horizontal solid line in FIG. 4. It is apparent that for a ratio value of V≤0.10 determined by evaluation device AV, it is ensured for a sensor actuation by a small finger as well as by a large finger that the touch occurs inside the area SF of the sensor field.

The proposed capacitive sensor system thus allows an accurate delimitation of the touch detection within large operator panels, regardless of the size of a finger that touches the sensor. In addition, the sensitive areas may be adapted to the geometry of the operator panel via a positionally accurate evaluation. The inner free spaces within the double ring-shaped electrode arrangement may be utilized for additional purposes, for example for placement of lighting elements.

LIST OF REFERENCE SYMBOLS

AV evaluation device
E, E1, E2 sensor electrodes (conductor loops)
F measured object (finger)
L, L1, L2 closed conductor loops (conductor sections)
S, S1, S2 sensor signals
S(x), S1(x), S2(x) sensor signal curves (general)
S(x)_L, S1(x)_L, S2(x)_L sensor signal curves (for a large finger)
S(x)_S, S1(x)_S, S2(x)_S sensor signal curves (for a small finger)
S2−S1 difference between sensor signals S2 and S1
S1+S2 sum of sensor signals S1 and S2
SF sensor surface
S_threshold threshold value, signal threshold
V ratio value
V(x), V(x)_L, V(x)_S ratio function
V_threshold threshold value
X direction coordinate
x (finger) position
0 origin point While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A capacitive sensor system for touch detection, comprising:
   a sensor surface;
   a first sensor electrode and a second sensor electrode both situated on and bordering the sensor surface, the first sensor electrode having a first closed conductor loop and the second sensor electrode having a second closed conductor loop;
   the first closed conductor loop surrounds the second closed conductor loop without the closed conductor loops touching each other whereby the first closed conductor loop encompasses more area of the sensor surface than the second closed conductor loop;
   each sensor electrode generates a sensor signal that depends on a position of a touch of an object on the sensor surface relative to the closed conductor loop of the sensor electrode, wherein the sensor signal of the second sensor electrode (i) is greater than the sensor signal of the first sensor electrode when the touch is within an area of the sensor surface bounded by the second closed conductor loop and (ii) is not greater than the sensor signal of the first sensor electrode when the touch is outside of an area of the sensor surface bounded by the first closed conductor loop; and
   an evaluation device for detecting the touch based on a comparison of a ratio value to a negative threshold value, wherein the ratio value is a ratio of (i) a difference of the sensor signal of the first sensor electrode subtracted from the sensor signal of the second sensor electrode and (ii) a sum of the sensor signals, the evaluation device detects the touch to be within the area of the sensor surface bounded by the second closed conductor loop when an additive inverse of the ratio value is less than the threshold value, and the evaluation device detects the touch to be outside of the area of the sensor surface bounded by the first closed conductor loop when the additive inverse of the ratio value is positive.

2. The capacitive sensor system of claim 1 wherein:
   the closed conductor loops are parallel closed conductor loops.

3. The capacitive sensor system of claim 1 wherein:
   sections of the closed conductor loops are in parallel to one another.

4. The capacitive sensor system of claim 1 wherein:
   both of the closed conductor loops have a circular, rectangular, or polygonal arrangement.

5. The capacitive sensor system of claim 1 wherein:
both of the closed conductor loops have a rectangular arrangement.

6. The capacitive sensor system of claim 1 wherein:
the closed conductor loops are concentric with one another.

7. A method for a capacitive sensor system having a sensor and a first sensor electrode and a second sensor electrode both situated on and bordering the sensor surface, the first sensor electrode having a first closed conductor loop and the second sensor electrode having a second closed conductor loop, the first closed conductor loop surrounds the second closed conductor loop without the closed conductor loops touching each other whereby the first closed conductor loop encompasses more area of the sensor surface than the second closed conductor loop, the method comprising:
generating, by the first sensor electrode, a first sensor signal that depends on a position of a touch of an object on the sensor surface relative to the first closed conductor loop of the first sensor electrode;
generating, by the second sensor electrode, a second sensor signal that depends on the position of the touch of the object on the sensor surface relative to the second closed conductor loop of the second sensor electrode, wherein the second sensor signal (i) is greater than the first sensor signal when the touch is within an area of the sensor surface bounded by the second closed conductor loop and (ii) is not greater than the first sensor signal when the touch is outside of an area of the sensor surface bounded by the first closed conductor loop; and
detecting, by an evaluation device, the touch based on a comparison of a ratio value to a negative threshold value, wherein the ratio value is a ratio of (i) a difference of the first sensor signal subtracted from the second sensor signal and (ii) a sum of the sensor signals, the evaluation device detects the touch to be within the area of the sensor surface bounded by the second closed conductor loop when an additive inverse of the ratio value is less than the threshold value, and the evaluation device detects the touch to be outside of the area of the sensor surface bounded by the first closed conductor loop when the additive inverse of the ratio value is positive.

8. The method of claim 7 wherein:
the closed conductor loops are parallel closed conductor loops.

9. The method of claim 7 wherein:
sections of the closed conductor loops are in parallel to one another.

10. The method of claim 7 wherein:
both of the closed conductor loops have a circular, rectangular, or polygonal arrangement.

11. A capacitive sensor system for touch detection, comprising:
a sensor surface;
a first sensor electrode having a first conductor section which forms a first closed conductor loop;
a second sensor electrode having a second conductor section which forms a second closed conductor loop;
the closed conductor loops being both situated on and bordering the sensor surface, the first closed conductor loop surrounding the second closed conductor loop, and the closed conductor loops being parallel with one another and non-touching each other whereby the first closed conductor loop encompasses more area of the sensor surface than the second closed conductor loop;
an evaluation device for evaluating a first sensor signal of the first sensor electrode and a second sensor signal of the second sensor electrode, wherein the first sensor signal depends on a position of a touch of an object in one direction in a plane of the sensor surface relative to the first closed conductor loop and the second sensor signal depends on the position of the touch of the object in the one direction in the plane of the sensor surface relative to the second closed conductor loop, wherein the second sensor signal (i) is greater than the first sensor signal when the touch is within an area of the sensor surface bounded by the second closed conductor loop and (ii) is not greater than the first sensor signal when the touch is outside of an area of the sensor surface bounded by the first closed conductor loop; and
wherein the evaluation device determines a ratio value from a ratio of (i) a difference of the first sensor signal subtracted from and the second sensor signal and (ii) a sum of the first sensor signal and the second sensor signal, compares the ratio value to a threshold value, and detects the touch as being within the area of the sensor surface bounded by the second closed conductor loop when an additive inverse of the ratio value is less than the threshold value and detects the touch as being outside of the area of the sensor surface bounded by the first closed conductor loop when the additive inverse of the ratio value is positive.

12. The capacitive sensor system of claim 11 wherein:
the closed conductor loops are parallel closed conductor loops.

13. The capacitive sensor system of claim 11 wherein:
sections of the closed conductor loops are in parallel to one another.

14. The capacitive sensor system of claim 11 wherein:
both of the closed conductor loops have a circular, rectangular, or polygonal arrangement.

15. The capacitive sensor system of claim 11 wherein:
both of the closed conductor loops have a rectangular arrangement.

16. The capacitive sensor system of claim 11 wherein:
the closed conductor loops are concentric with one another.

* * * * *

UNITED STATES PATENT AND TRADEMARK OFFICE
CERTIFICATE OF CORRECTION

Page 1 of 1

PATENT NO. : 11,106,313 B1
APPLICATION NO. : 17/120359
DATED : August 31, 2021
INVENTOR(S) : Matthias Seifert et al.

It is certified that error appears in the above-identified patent and that said Letters Patent is hereby corrected as shown below:

In the Claims

Column 9, Lines 7-8, Claim 7:
After "having a sensor"
Insert -- surface --.

Signed and Sealed this
Seventh Day of December, 2021

Drew Hirshfeld
*Performing the Functions and Duties of the
Under Secretary of Commerce for Intellectual Property and
Director of the United States Patent and Trademark Office*